(12) United States Patent
Barrenscheen

(10) Patent No.: US 7,474,240 B2
(45) Date of Patent: Jan. 6, 2009

(54) SIGNAL CONVERTER AND METHOD FOR OPERATING A SIGNAL CONVERTER

(75) Inventor: Jens Barrenscheen, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/679,587

(22) Filed: Feb. 27, 2007

(65) Prior Publication Data

US 2007/0200745 A1    Aug. 30, 2007

(30) Foreign Application Priority Data

Feb. 27, 2006   (DE)   ........................ 10 2006 009 033

(51) Int. Cl.
    *H03M 1/00*   (2006.01)
(52) U.S. Cl. ........................................ 341/141; 710/69
(58) Field of Classification Search ................ 341/141, 341/155; 370/433, 378; 710/69
    See application file for complete search history.

(56) References Cited

U.S. PATENT DOCUMENTS

| 5,619,201 A | * | 4/1997 | Imakura ..................... 341/141 |
| 5,838,686 A | * | 11/1998 | Ozkan ........................ 370/433 |
| 6,674,753 B1 | * | 1/2004 | Harasaki et al. ............. 370/378 |
| 6,788,230 B2 | * | 9/2004 | Ahn ........................... 341/131 |
| 7,039,115 B1 | * | 5/2006 | Wu ........................ 375/240.26 |

* cited by examiner

*Primary Examiner*—Peguy JeanPierre
(74) *Attorney, Agent, or Firm*—Dicke, Billig & Czaja, PLLC

(57) ABSTRACT

A method for operating a signal converter, and a signal converter is disclosed. One embodiment has at least one register and a plurality of input channels, wherein information stored in the register is variably assignable to at least one of the plurality of input channels by one or a plurality of corresponding assignment bits.

21 Claims, 1 Drawing Sheet

US 7,474,240 B2

SIGNAL CONVERTER AND METHOD FOR OPERATING A SIGNAL CONVERTER

CROSS-REFERENCE TO RELATED APPLICATIONS

This Utility Patent Application claims priority to German Patent Application No. DE 10 2006 009 033.0 filed on Feb. 27, 2006, which is incorporated herein by reference.

BACKGROUND

The invention relates to a signal converter, in one embodiment an analog-digital converter, and to a method for operating a signal converter.

Conventional microcontroller or microprocessor systems include one or a plurality of (central) control or processing units (Central Processing Units (CPUs), or CPU "cores") that are connected with one or a plurality of memories, e.g., a program and a data memory means ("program memory" and "data memory"). The memories may be provided on one and the same chip as the corresponding microcontroller or microprocessor (so-called "embedded" microcontroller or microprocessor system), or may alternatively also be provided separately therefrom. The "program memory" includes in particular the sequence of instructions to be processed by the CPU core(s), i.e. the program (and possibly additionally corresponding data constants to be used by the CPU core(s)). In the "data memory", the variables—that are possibly to be modified in particular by the CPU core(s) during the execution of the program—may be stored.

Conventional microcontroller or microprocessor systems—e.g., systems that are used in the automotive field—frequently also include one or a plurality of signal converters, in particular analog-digital converters.

By using an analog-digital converter, an analog input signal, e.g., a corresponding measurement voltage, may be converted to a digital numerical value that is "understandable" for the corresponding microcontroller or microprocessor processing unit.

Analog-digital converters may operate in accordance with a plurality of different converting methods, e.g., the parallel method, the weighing method, or the counting method, etc. (or also mixed forms thereof).

In the case of the parallel method, the input signal or the input voltage, respectively, is, by using corresponding comparators, simultaneously compared with n different reference voltages, and it is determined between which two reference voltages the input voltage ranges. This way, the digital numerical value or the corresponding dual number, respectively, pertaining to the input signal may be determined in one single step or process. The relatively high switching effort is, however, of disadvantage since a relatively great number of comparators are needed.

In the case of the weighing method, other than with the parallel method, the digital numerical value pertaining to the input signal is not determined in one single step, but in several processes, wherein only one respective position of the corresponding dual number is determined per step. In so doing, the respectively highest dual number position is initially started with, and it is determined whether the input voltage is greater or smaller than the reference voltage assigned to the highest dual number position (which may in particular e.g., correspond to half the value of the corresponding maximum voltage). If the input voltage is smaller, the highest position is set to "0", otherwise to "1", and the reference voltage assigned to the highest dual number position is subtracted from the input voltage. Next, it is determined whether the input voltage or the remaining voltage obtained by the above-mentioned subtraction, respectively, is greater or smaller than the reference voltage assigned to the next-highest dual number position (which may in particular e.g., correspond to a quarter of the maximum voltage). If it is smaller, the next-highest position is set to "0", otherwise to "1", etc. In the case of the weighing method, a number of comparison steps and reference voltages corresponding to the number of positions of the dual number is thus required.

In the case of the counting method it is determined how often the reference voltage assigned to the lowest position of the dual number has to be added to obtain the input voltage. The number of processes necessary for determining the digital number value pertaining to the input voltage corresponds to the respective digital number value, i.e. the counting method is relatively little expensive, but relatively slow.

Conventional analog-digital converters may include several, different input channels via which the input voltages to be converted are supplied to the corresponding analog-digital converter.

By using an analog multiplexer, one respective of the input channels can be selected, and the signal present at this input channel can be supplied to the actual converter.

For each input channel, a register that is specifically assigned thereto may be provided, by which additional information that is applicable for the respective input channel is provided for the converter.

The additional information stored in the above-mentioned registers may, for instance, be indications concerning the "sample time"—depending, for instance, on the impedance of the source connected to the input channel—to be used for the respective input channel, i.e. the time that has to be waited until the actual voltage measurement can be performed.

Alternatively or additionally, information about the reference voltage to be used for the respective input channel may, for instance, also be stored in the above-mentioned registers, and/or a plurality of further parameters concerning the respective input channel.

The fact that an own register is provided for each input channel results—in particular with a relatively high number of input channels—in a relatively high space requirement.

With alternative prior art solutions, one single register is used for all input channels, i.e. respectively identical additional information for all input channels.

This results in a relatively low flexibility of the corresponding analog-digital converter.

For these and other reasons, there is a need for the present invention.

SUMMARY

One embodiment provides a signal converter having at least one register. The signal converter includes a plurality of input channels, wherein information stored in the register is variably assignable to at least a respective one of the plurality of input channels by one or a plurality of corresponding assignment bits.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
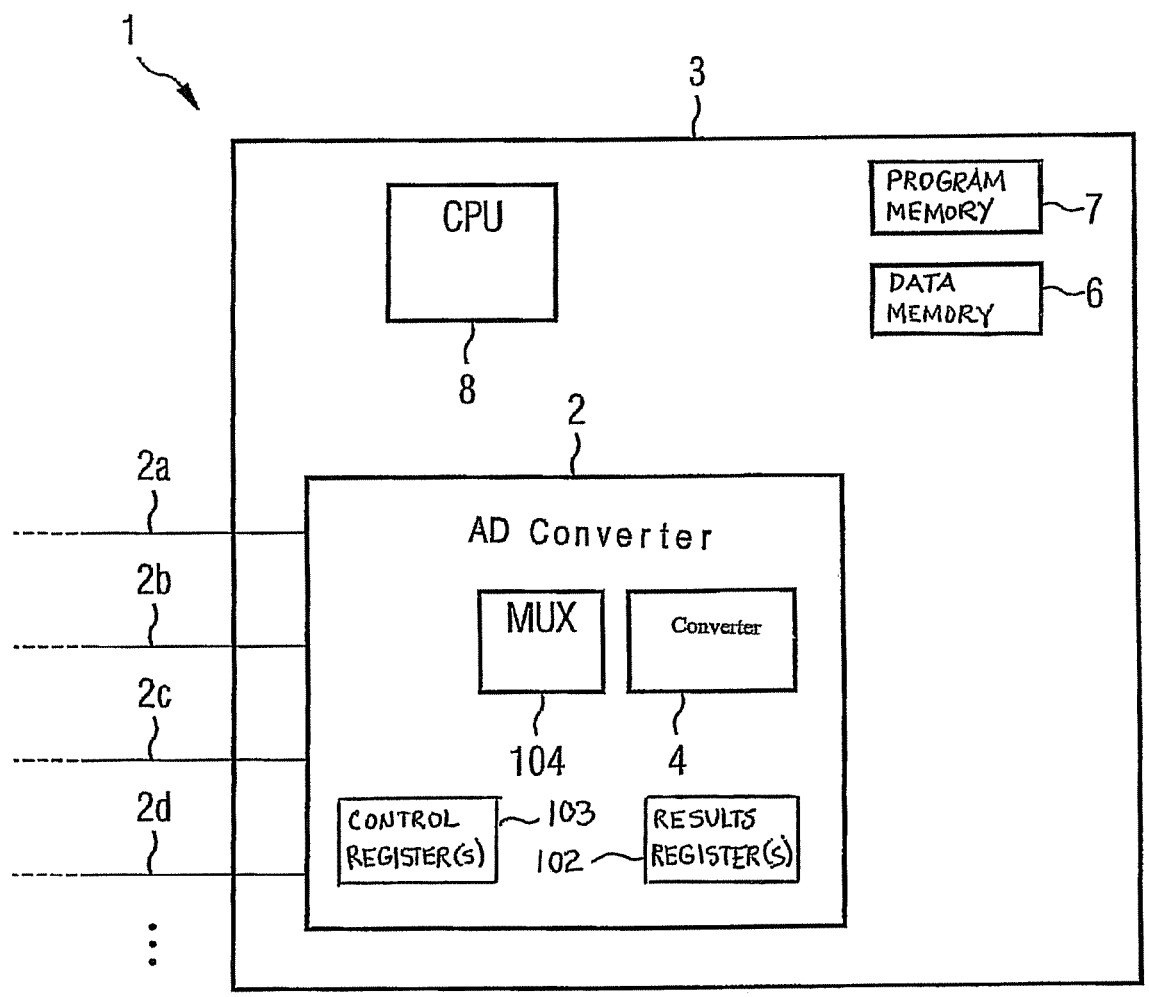
FIG. 1 a schematic, exemplary representation of an electronic system, in particular a microcontroller or microprocessor system, having an analog-digital converter in accordance with an embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A signal converter is provided. In one embodiment, the signal converter is an analog-digital converter. The present invention also provides a method for operating a signal converter. The above-mentioned and/or further drawbacks of conventional devices and methods can be avoided at least partially, in particular a device and a method by which the space requirement can be reduced—with relatively high flexibility—vis-à-vis conventional devices and methods.

In accordance with one embodiment of the invention there is provided a signal converter, in one embodiment an analog-digital converter, having at least one register and a plurality of input channels, wherein information stored in the register is variably assignable, by one or a plurality of corresponding assignment bits, to at least one respective of the plurality of input channels.

By the variable assignability of the information stored in the register to a corresponding—variably selectable—input channel, the corresponding information need not be stored for each input channel separately, e.g., multiply in several different registers.

The result is a reduced space requirement vis-à-vis prior art.

In accordance with a further embodiment of the invention there is provided a method for operating a signal converter, in one embodiment an analog-digital converter, having at least one register and a plurality of input channels, wherein the method includes the following process:

assigning of information that is storable in the register to at least one of the plurality of input channels by programming one or a plurality of assignment bits.

A respective input channel to be converted is (additionally also) selected by the assignment bit(s).

In accordance with one embodiment, an analog-digital converter (AD converter) 2 is arranged on a corresponding microcontroller or microprocessor 3, or a corresponding microcontroller or microprocessor chip, respectively, or any other semiconductor chip.

In alternative, not illustrated embodiments, the analog-digital converter (AD converter) 2 may also be arranged separately from the microcontroller or microprocessor 3, in particular on a (further) chip that is provided separately from the microcontroller or microprocessor 3.

The microcontroller or microprocessor 3 may include one or a plurality of (central) control or computing units 8 (Central Processing Unit 8 (CPU), or CPU "core", respectively) which are connected with one or a plurality of memories, e.g., a program memory 7 and a data memory 6.

In one embodiment, the program and the data memories 6, 7 may, for instance, be provided on one and the same chip as the corresponding microcontroller or microprocessor 3 (so-called "embedded" microcontroller or microprocessor system), or may alternatively also be provided separately therefrom.

The program memory 7 includes in particular the sequence of the instructions to be processed by the CPU(s) 8, i.e. the program (and possibly additionally corresponding data constants to be used by the CPU(s) 8 (i.e. program data).

Contrary to this, the variables—that are possibly to be modified in particular by the CPU(s) 8 during the execution of the program—(or corresponding application data) may, for instance, be stored in the data memory 6.

The data memory 6 may e.g., be formed by one or several RAMs (RAM=Random Access Memory or read write memory), in particular e.g., DRAMs (DRAM=Dynamic Random Access Memory), or SRAMs (SRAM=Static Random Access Memory).

An appropriate, non-volatile memory device, e.g., an EPROM (Erasable PROM) or EEPROM (Electrically Erasable PROM), in particular e.g., a flash EEPROM, may be used as program memory 7. Alternatively, a RAM, in particular e.g., a DRAM, may be used as program memory 7. Alternatively, a RAM, in particular e.g., a DRAM, may, for instance, also be used as program memory 7.

The microcontroller or microprocessor 3 may, via one or a plurality of bus systems, be connected to one or a plurality of further system modules that is/are connected to the bus system(s) and communicate with each other via the bus system(s).

The microcontroller or microprocessor system 1 illustrated in FIG. 1 may, for instance, be used in a motor vehicle, e.g., for controlling distributed electrical systems (e.g., for controlling direct current motors and/or stepping motors for electric window lifts and side mirrors, for adjusting the lower-beam headlamp, for managing sensor information to control the air conditioning system and/or the seating position, etc.).

The microcontroller or microprocessor 3 may, for instance, be an 8-bit, 16-bit, or 32-bit microcontroller, or any other microcontroller or microprocessor or DSP.

Using the analog-digital converter 2, an analog input signal—transmitted, for instance, via an analog line, and originating e.g., from one of the above-mentioned system modules, and supplied to the analog-digital converter 2 via a corresponding input channel 2a, 2b, 2c, 2d—, e.g., a corresponding measurement voltage, may be converted to a digital numerical value that is "understandable" for the microcontroller or microprocessor 3 or its CPU 8, respectively.

For converting the input signal to a corresponding digital numerical value, the analog-digital converter 2 includes a signal converter 4 that operates, for instance, in accordance with the parallel method, the weighing method, or the counting method, etc., or any other method.

For storing the digital numerical values generated by the signal converter 4, one or a plurality of (result) registers 102 are provided.

As results from FIG. 1, the analog-digital converter 2 includes a plurality of (e.g., more than three, more than five, more than ten, more than thirty, etc., e.g., 8, 16, or 32) different input channels 2a, 2b, 2c, 2d via which the input voltages to be converted are supplied to the analog-digital converter 2.

Using an analog multiplexer 104, a respective one of the input channels 2a, 2b, 2c, 2d can be selected for conversion, and the signal to be converted that is present at this input channel 2a, 2b, 2c, 2d, e.g., the corresponding measurement voltage, can be transmitted to the signal converter 4.

As results further from FIG. 1, and as will be explained in more detail in the following, the microcontroller or microprocessor 3, in particular the analog-digital converter 2, further includes one or a plurality of—programmable—(control) registers 103 by which additional information applicable for the respectively selected input channel 2a, 2b, 2c, 2d or the respective input channel 2a, 2b, 2c, 2d to be converted, respectively, are provided for the signal converter 4.

The number of control registers 103 may be smaller than the number of input channels 2a, 2b, 2c, 2d (e.g., by more than two, four, or eight smaller, or e.g., by more than ¼ or ⅓ smaller, etc.).

Other than in prior art, a specifically assigned (control) register is thus not cogently provided for each input channel 2a, 2b, 2c, 2d.

The additional information stored in the (control) register(s) 103 may, for instance, be indications concerning the "sample time"—depending, for instance, on the impedance of the source connected to the input channel 2a, 2b, 2c, 2d—to be used for the respective input channel 2a, 2b, 2c, 2d to be converted, i.e. the time that has to be waited until the actual voltage measurement can be performed.

Alternatively or additionally, information about the reference voltage to be used for the respective input channel 2a, 2b, 2c, 2d to be converted may also be stored in the above-mentioned (control) register(s) 103, and/or a plurality of further parameters concerning the respective input channel 2a, 2b, 2c, 2d to be converted.

In the control register(s) 103—as will be explained in more detail in the following—one or several bits ("alias bits") may be stored in a separate field, the "alias bits" indicating to the signal converter 4 and/or the analog multiplexer 104 for which input channel 2a, 2b, 2c, 2d the additional information stored in the respective (control) register 103 is to be applicable.

To this end, a digital identifier clearly identifying a respective input channel 2a, 2b, 2c, 2d may be assigned to each or part of the input channels 2a, 2b, 2c, 2d. The digital identification may, for instance, include a bit number that is large enough that all input channels 2a, 2b, 2c, 2d (or the above-mentioned part of the input channels) can be identified clearly (e.g., four bits with sixteen input channels 2a, 2b, 2c, 2d to be identified, five bits with twenty-two input channels 2a, 2b, 2c, 2d to be identified, etc., wherein e.g., the bit sequence "0001" or "00001", respectively, may be assigned to a first input channel 2a as identification or alias bits, respectively, e.g., the bit sequence "0010" or "00010" to a second input channel 2b as identification or alias bits, respectively, the bit sequence "0011" or "00011" to a third input channel 2c as identification or alias bits, respectively, etc.).

y Using the alias bits stored in the respective (control) register 103, it may be indicated to the signal converter 4 or analog multiplexer 104, respectively, for which of the input channels 2a, 2b, 2c, 2d a conversion is to be performed.

A corresponding (control) register 103 may, for instance, be assigned to part of (or all) the input channels 2a, 2b, 2c, 2d.

If a corresponding input channel 2a, 2b, 2c, 2d is provided for conversion in accordance with the respective conversion progress control, the alias bits stored in the assigned (control) register 103 are recalled; if they are not set (—if the bit sequence "0000" or "00000" is, for instance, stored there—), a corresponding conversion is performed by the signal converter 4 for the input channel 2a, 2b, 2c, 2d assigned to the (control) register 103, namely by using the conversion parameters stored in the assigned (control) register 103 in the form of the above-mentioned additional information (by which—as explained above—the "sample time" is, for instance, determined, and/or the respective reference voltage to be used, etc.).

If, instead, the alias bits stored in the assigned (control) register 103 provided for the input channel 2a, 2b, 2c, 2d for conversion in accordance with the respective conversion progress control are set, the signal converter 4 performs a corresponding conversion for the input channel 2a, 2b, 2c, 2d determined by the respective alias bits instead for the input channel 2a, 2b, 2c, 2d provided for conversion in accordance with the progress control (namely—again—by using the conversion parameters stored in the respective (control) register 103 in the form of the above-mentioned additional information—i.e. the parameters actually stored for the input channel 2a, 2b, 2c, 2d provided for conversion in accordance with the progress control).

The analog multiplexer 104 then does not transmit to the signal converter 4 the signal present at the input channel 2a, 2b, 2c, 2d assigned to the corresponding (control) register 103, but the signal present at the input channel 2a, 2b, 2c, 2d specified by the alias bits.

By the setting of the alias bits of a (control) register 103, a "deflecting" or "surrendering" of the additional information stored in the respective (control) register 103 to another input channel 2a, 2b, 2c, 2d than the input channel 2a, 2b, 2c, 2d assigned to the respective (control) register 103 can thus be achieved.

For input channels 2a, 2b, 2c, 2d "deflected" or "deflectable" by alias bits, no separate (control) register has to be provided; this results in a reduced space requirement vis-à-vis prior art.

The respective conversion progress control—i.e. the determination of the order in which particular input channels 2a, 2b, 2c, 2d (determined by the progress control) have to be converted, and/or when exactly a conversion has to be performed for which input channel 2a, 2b, 2c, 2d (e.g., triggered by particular events, e.g., in regular, predetermined intervals, etc.)—may be achieved by storing corresponding progress control bits in one or a plurality of corresponding—not illustrated—progress control register(s).

By the setting of the above-mentioned alias bits in one or a plurality of the above-mentioned (control) registers 103, one and the same conversion progress control—which has to be stored once only by using corresponding progress control bits—can be used for a plurality of different input channels 2a, 2b, 2c, 2d or a plurality of different combinations of input channels 2a, 2b, 2c, 2d, respectively.

By storing corresponding progress control bits in a corresponding progress control register it may, for instance, be determined that a corresponding conversion is to be performed initially for the first input channel 2a, then for the third input channel 2c, and subsequently for the second input channel 2b. By setting the alias bits e.g., in the (control) register assigned to the third input channel 2c such that they refer to the fourth input channel 2d, a conversion will then be performed in the order: first input channel 2a, fourth input channel 2d, second input channel 2b (instead of first input channel 2a, third input channel 2c, second input channel 2b).

The above-mentioned multiple use of progress control registers or of the progress control bits stored there, respectively, results in a further reduced space requirement vis-à-vis prior art.

The programming, i.e. setting and/or resetting of alias bits in the above-mentioned (control) register(s) 103, or the writing and/or deleting of alias bits, respectively, can be performed during the going operation of the analog-digital converter 2 (i.e. the alias bits may be flexibly adapted or changed, respectively, during the going operation of the analog-digital converter 2—i.e. during or after corresponding analog-digital conversions are/were performed by the signal converter 4). Alternatively or additionally, corresponding alias bits may also be correspondingly set (and/or be reset again) prior to the actual working operation of the analog-digital converter 2.

The programming, i.e. the setting and/or resetting of alias bits may, for instance, be performed by the CPU 8 or the program stored on the above-mentioned memories 6, 7, respectively, without the cooperation of the CPU 8—by a corresponding DMA (direct memory access) mechanism, etc.

As has already been explained above, no separate (control) register has to be provided for input channels 2a, 2b, 2c, 2d that are "deflected" or "deflectable", respectively, by alias bits, which results in a reduced space requirement vis-à-vis prior art.

The (control) registers 103 of those input channels 2a, 2b, 2c, 2d for which no conversions are to be performed (and/or for which corresponding conversions are to be performed relatively rarely only) can be surrendered to other input channels 2a, 2b, 2c, 2d by setting corresponding alias bits in the (control) registers 103 assigned to these input channels 2a, 2b, 2c, 2d.

The case that no conversions are to be performed for a corresponding input channel 2a, 2b, 2c, 2d (and/or that corresponding conversions are to be performed relatively rarely only for a corresponding input channel 2a, 2b, 2c, 2d) occurs, for instance, if the signal present at a corresponding input channel 2a, 2b, 2c, 2d is exclusively (or in most cases, or relatively frequently) used as reference voltage for one or a plurality of other input channels 2a, 2b, 2c, 2d.

The above-mentioned microcontroller or microprocessor 3, or—more generally—the above-mentioned semiconductor chip on which the analog-digital converter 2 is provided may be accommodated arbitrarily in one of a plurality of differently designed semiconductor device packages (i.e. arbitrarily in one of a plurality of possible semiconductor device package variants).

With a respective first group of the above-mentioned semiconductor device package variants, all of the above-mentioned input channels 2a, 2b, 2c, 2d or all of the pads of the semiconductor chip connected therewith, respectively, may—for instance, via corresponding bond wires—be connected with corresponding pins of the corresponding semiconductor device package—all input channels 2a, 2b, 2c, 2d, are thus accessible from outside.

Contrary to this, with a further group of the above-mentioned semiconductor device package variants, only part of the above-mentioned input channels 2a, 2b, 2c, 2d (or only part of the corresponding pads of the semiconductor chip connected therewith, respectively) may be connected with corresponding pins of the corresponding semiconductor device package—thus only part of the above-mentioned input channels 2a, 2b, 2c, 2d is accessible from outside.

The (control) registers 103 of those input channels 2a, 2b, 2c, 2d which are not accessible from outside may be surrendered to other input channels 2a, 2b, 2c, 2d —that are accessible from outside—by setting corresponding alias bits in the (control) registers 103 assigned to these input channels 2a, 2b, 2c, 2d.

Furthermore, one or a plurality of the above-mentioned input channels 2a, 2b, 2c, 2d may, for instance, be provided as internal test input channels. Such test input channels may be designed as input channels that are not accessible from outside (a corresponding input channel 2a, 2b, 2c, 2d may, for instance, not be connected to a corresponding pad of the semiconductor chip (neither/nor to a corresponding pin of the semiconductor chip package)).

No separate (control) registers are used for such test input channels, but instead corresponding (control) registers 103 of usual input channels 2a, 2b, 2c, 2d which are surrendered to corresponding test input channels by setting corresponding alias bits in the (control) registers 103 assigned to these usual input channels 2a, 2b, 2c, 2d.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A signal converter comprising:
   at least one register; and
   a plurality of input channels, wherein information stored in the register is variably assignable to at least a respective one of the plurality of input channels by one or a plurality of corresponding assignment bits, wherein the register is assigned to one of the input channels and, if the assignment bit(s) is/are not set, the information stored in the register is assigned to the input channel assigned to the register.

2. The signal converter of claim 1, comprising wherein the assignment bit(s) is/are stored in a separate field of the register.

3. The signal converter of claim 1, comprising wherein a sample time is determined by the information stored in the register for the respective input channel assigned to the information.

4. The signal converter of claim 1, comprising wherein a respective reference voltage to be used is determined by the information stored in the register for the respective input channel assigned to the information.

5. The signal converter of claim 1, comprising wherein, if the assignment bit(s) is/are set, the information stored in the register is assigned to the input channel determined by the assignment bit(s).

6. The signal converter of claim 1, comprising wherein a respective input channel to be converted is selected by the assignment bit(s).

7. The signal converter of claim 6, comprising an analog multiplexer controlled by using the assignment bit(s).

8. A signal converter comprising:
   a plurality of input channels; and
   a plurality of registers each assigned to one of the input channels, wherein the register number is smaller than the number of input channels, and wherein information stored in each register is variably assignable to at least a respective one of the plurality of input channels by one or a plurality of corresponding assignment bits.

9. A method for operating a signal converter comprising:
providing an analog-digital converter having at least one register and a plurality of input channels; and
assigning information that can be stored in the at least one register to at least one of the plurality of input channels by programming one or a plurality of assignment bits, wherein the at least one register is assigned to one of the input channels and, if the assignment bit(s) is/are set, the information stored in the at least one register is assigned to the input channel assigned to the register.

10. The method of claim 9, comprising determining a sample time for the respective input channel assigned to the information by the information that can be stored in the register.

11. The method of claim 9, comprising determining using a respective reference voltage for the respective input channel assigned to the information by the information that can be stored in the register.

12. A signal converter comprising:
an analog-digital converter having at least one register, and a plurality of input channels, wherein information stored in the register is variably assignable to at least a respective one of the plurality of input channels by one or a plurality of corresponding assignment bits, wherein the register is assigned to one of the input channels and, if the assignment bit(s) is/are not set, the information stored in the register is assigned to the input channel assigned to the register.

13. The signal converter of claim 12, comprising wherein the assignment bit(s) is/are stored in a separate field of the register.

14. The signal converter of claim 13, comprising wherein a sample time is determined by the information stored in the register for the respective input channel assigned to the information.

15. The signal converter of claim 14, comprising wherein a respective reference voltage to be used is determined by the information stored in the register for the respective input channel assigned to the information.

16. The signal converter of claim 12, comprising wherein, if the assignment bit(s) is/are set, the information stored in the register is assigned to the input channel determined by the assignment bit(s).

17. The signal converter of claim 12, comprising wherein a respective input channel to be converted is selected by the assignment bit(s).

18. The signal converter of claim 17, comprising an analog multiplexer controlled by using the assignment bit(s).

19. A signal converter comprising:
an analog-digital converter having a plurality of input channels and a plurality of registers each assigned to one of the input channels wherein the number of registers is smaller than the number of input channels, and wherein information stored in a register is variably assignable to at least a respective one of the plurality of input channels by one or a plurality of corresponding assignment bits.

20. An analog-digital signal converter, comprising
at least one register;
a plurality of input channels; and,
means for variably assigning information stored in the at least one register to at least a respective one of the plurality of input channels by at least one corresponding assignment bit, wherein the at least one register is assigned to one of the input channels and, if the assignment bit(s) is/are not set, the information stored in the register is assigned to the input channel assigned to the register.

21. A signal converter comprising:
at least one register; and
a plurality of input channels, wherein information stored in the at least one register is variably assignable to at least a respective one of the plurality of input channels by at least one corresponding assignment bit, and wherein the number of registers is smaller than the number of input channels.

* * * * *